(12) United States Patent
Offenberg et al.

(10) Patent No.: US 9,704,913 B2
(45) Date of Patent: Jul. 11, 2017

(54) MANUFACTURING OF AN IMAGER DEVICE AND IMAGER DEVICE

(71) Applicant: Infineon Technologies AG, Neubiberg (DE)

(72) Inventors: Dirk Offenberg, Dresden (DE); Henning Feick, Dresden (DE); Stefano Parascandola, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 374 days.

(21) Appl. No.: 14/033,317

(22) Filed: Sep. 20, 2013

(65) Prior Publication Data

US 2014/0077066 A1 Mar. 20, 2014

Related U.S. Application Data

(60) Provisional application No. 61/703,759, filed on Sep. 20, 2012.

(51) Int. Cl.
*H01L 27/146* (2006.01)
*G01S 7/491* (2006.01)

(52) U.S. Cl.
CPC ...... *H01L 27/14683* (2013.01); *G01S 7/4914* (2013.01); *H01L 27/14601* (2013.01)

(58) Field of Classification Search
CPC ......... H01L 27/14683; H01L 27/14601; G01S 7/4914
USPC ........................................... 250/208.1
See application file for complete search history.

(56) References Cited

U.S. PATENT DOCUMENTS

| 2007/0164767 | A1 | 7/2007 | Herz |
| 2007/0187724 | A1* | 8/2007 | Kaufmann ........ H01L 27/14603 257/239 |
| 2008/0239466 | A1* | 10/2008 | Buettgen ........... H01L 31/02005 359/325 |
| 2010/0201966 | A1 | 8/2010 | Mase et al. |
| 2011/0089471 | A1 | 4/2011 | Buettgen |

FOREIGN PATENT DOCUMENTS

EP 0862226 9/1998

* cited by examiner

*Primary Examiner* — Kevin Pyo
(74) *Attorney, Agent, or Firm* — Harrity & Harrity, LLP

(57) ABSTRACT

Embodiments related to the manufacturing of an imager device and an imager device are disclosed. Embodiments associated with methods of an imager device are also disclosed.

32 Claims, 7 Drawing Sheets

MANUFACTURING OF AN IMAGER DEVICE AND IMAGER DEVICE

RELATED APPLICATIONS

This application claims priority benefit of Provisional Application No. 61/703,759, which was filed on Sep. 20, 2012. The entire contents of the Provisional Application No. 61/703,759 are hereby incorporated herein by reference.

BACKGROUND

Devices that detect light are used in many applications and variations. In addition to solid state imagers like CCD (charge coupled devices) imagers or CMOS (Complementary Metal Oxide Semiconductor) imagers which are capable of providing 2D (2 dimensional) images, 3D imager, depth imagers, range finders etc are becoming increasingly popular for multiple applications. Applications include for example the taking of a profile of objects or environments, the determining of an object distance, the tracking and recognition of objects to the recognition of movements or gestures by human objects.

In solid state photo conversion devices such as semiconductor imager devices, incoming light is converted into charge carriers of positive type (holes) and negative types (electrons). In many applications the transfer of charge carriers of one or both types to predetermined areas such as a read-out node is crucial to the operation of the imager.

In the manufacturing process of some imager devices, gate structures are formed laterally spaced apart by gaps. Between the gate structures, manufacturing steps such as spacer and/or liner are formed. The processing of the spacer or liner as well as other processes typically provides damages to the surfaces of the substrate. This causes increased trapping and recombination as well as other adverse effect on the charge transfer.

It is therefore beneficial to have a device manufactured such that the transfer of photo-generated charge carriers is provided in a more efficient way.

SUMMARY

According to one aspect, a method of manufacturing an imager device, includes the forming of a first control electrode, a second control electrode and a third control electrode to provide during operation of the imager device a potential distribution for transferring photo-generated charge carriers. The first, second and third control electrodes being laterally spaced apart from each other. First electrical connection to the first control electrode for supplying an electric driving signal to the first control electrode during operation of the imager device and second electrical connection to the second control electrode for providing an electric potential to the second control electrode during operation of the imager device are formed. The third control electrode has a capacitive coupling to the first control electrode and to the second control electrode such that a third electric potential of the third control electrode is generated by the capacitive coupling at a value between the values of the first electric potential applied to the first control electrode and the second electric potential applied to the second control electrode.

According to one aspect, an imager device has a pixel structure, wherein a pixel of the pixel structure includes a semiconductor substrate region comprising a conversion region to convert light into photo-generated charge carriers. The pixel structure further includes a first control electrode, a second control electrode and a third control electrode. A first electric circuit is provided to apply a time-varying first electric potential to the first control electrode, a second electric circuit to apply a second electric potential to the second control electrode, wherein the third control electrode is capacitive coupled to the first control electrode and to the second control electrode such that the third control electrode is provided by the capacitive coupling during at a third electric potential of a level which is between the levels of the time-varying first electric potential applied to the first control electrode and the second electric potential applied to the second control electrode.

DETAILED DESCRIPTION

Figure 1A:
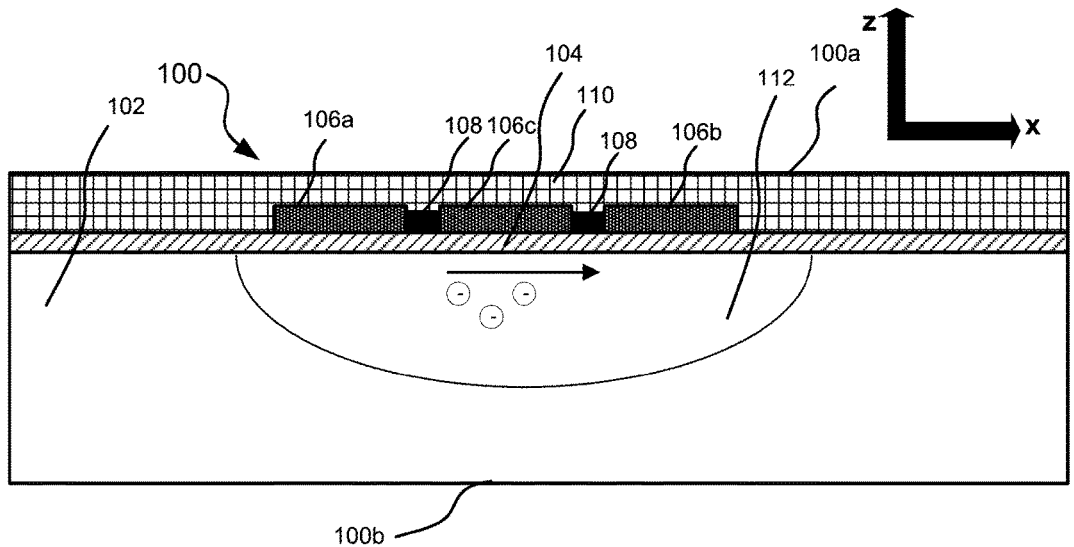
FIG. 1A shows a cross-sectional view according to an embodiment.

The following detailed description explains exemplary embodiments of the present invention. The description is not to be taken in a limiting sense, but is made only for the purpose of illustrating the general principles of embodiments of the invention while the scope of protection is only determined by the appended claims.

In the embodiments shown in the drawings, structures or other entities may not be drawn to scale. For example, some structures or features may be drawn with a much larger scale than other structures or features of a same figure.

In the embodiments shown in the drawings and described below, a direct connection or coupling between functional blocks, devices, components or other physical or functional units shown in the drawings or described herein may also be implemented by an indirect connection or coupling unless explicitly noted otherwise. Functional blocks may be implemented in hardware, firmware, software, or a combination thereof.

Further, it is to be understood that the features of the various exemplary embodiments described herein may be combined with each other, unless specifically noted otherwise.

In the various figures, identical or similar entities, modules, devices etc. may have assigned the same reference number.

The term vertical is used in a non-limiting way to describe in embodiments directions vertical or substantially vertical to a surface of a substrate such as a main surface of the substrate. The term lateral is used in a non-limiting way to describe in embodiments directions parallel or substantially parallel to a surface of a substrate such as a main surface of the substrate.

The term substrate used in embodiments may include but is not limited to semiconductor substrates such as a semiconductor die, a stacked die, a semiconductor die with additional semiconductor layers such as epi-layers (epitaxial layers), poly-silicon layers etc or a semiconductor die with additional non-semiconductor layers.

Referring now to FIG. 1A, a first embodiment of a device 100 will be described. Device 100 may include in embodiments an imager device. In some embodiments, device 100 may include an optical 3D imager device based on the time of flight concept. While FIG. 1A shows a single pixel, it is to be understood that in some embodiments, device 100 may comprise a plurality of pixels arranged for providing an image of an object. In such embodiment, the structure shown in the embodiments in FIG. 1A and later on may be repeated many times on the devices to form an array of pixels. In some embodiments, device 100 however may include only one pixel, for example in a range finder where only single distance information is determined.

Device 100 includes a semiconductor substrate 102 with a photo-conversion region 112. The device is configured such that light penetrates into the photo-conversion region 112 and at least a part of the incoming light is converted into charge carriers, e.g. electrons and holes. In some embodiments, the light might be introduced to the photo-conversion region from a front side 100a of the device 100. In other embodiments, the light might be introduced to the photo-conversion region from the back side 100b of device 100.

The device 100 further includes a layer 104 of insulating material above which a first control electrode 106a, a second control electrode 106b and a third control electrode 106c are provided. Layer 104 is typically provided as thin layer and may for example include silicon oxide. Control electrodes may in some embodiments form the modulation gates of a demodulation structure within a pixel of a continuous wave time of flight imager.

Structures 108 are formed between the control electrodes 106a, 106b, 106c. The structures 108 may include for example spacers or liners generated in the manufacturing process for electric isolation of the control electrodes 106a, 106b, 106c.

Furthermore, a cover layer 110 extending above the semiconductor substrate 102 is provided. As can be seen from FIG. 1A, the cover layer covers the control electrodes 106a, 106b, 106c and the structures 108 provided in the device 100.

In the embodiment of FIG. 1A, the third control electrode is arranged between the first control electrode 106a and the second control electrode 106b with respect to a lateral direction (x-direction). In some embodiments, the third control electrode has a lateral distance to at least one of the first or second control electrode between 50 nm and 1 μm, where each value within this range constitutes one embodiment. In some embodiments, the third control electrode has a lateral distance to at least one of the first or second control electrode between 0.1 μm and 0.5 μm. In some embodiments, the third control electrode has a lateral distance to both of the first or second control electrode between 50 nm and 1 μm, where each value within this range constitutes one embodiment. In some embodiments, the third control electrode has a lateral distance to both of the first or second control electrode between 0.1 μm and 0.5 μm.

As will be described later on, such distances as described above may provide in some embodiments good capacitive coupling which allows to advantageously operate the control electrodes for example as modulation gates in photon mixer operations.

In embodiments, the control electrodes 106a, 106b and 106c are manufactured such that the control electrodes are transparent or at least semi-transparent to the incoming light generating the charge carriers in the photo-conversion region 112. This may be provided by having a respective thin layer for the electrodes and/or using material which is transparent or semi-transparent for the incoming light. In some embodiments, the light of operation may be infrared light or near-infrared light. As will be described later on, the light of operation may be modulated when emitted from a light source by a modulation signal. When used within a demodulation pixel, the control electrodes are then provided with a signal which is derived from the light modulation signal and/or has a same frequency as the light modulation signal.

In embodiments, the control electrodes 106a, 106b, 106c are electrodes to direct the photo-generated charge carriers in a lateral direction based on the potentials present at the respective control electrodes 106a, 106b, 106c. In embodiments, the potentials at the control electrodes 106a, 106b, 106c causes the generating of space charge regions in semiconductor regions below the respective control electrode. As will be described further below, the device 100 is capable to generate space charge regions of different extensions below the respective control electrodes 106a, 106b, 106c based on the respective electric potential present at the control electrode. As a result a potential distribution for photo-generated charge carriers is generated in the semiconductor region near the substrate surface causing a drift field in a lateral direction depending on the potentials present at the control electrodes 106a, 106b, 106c.

As will be described further below, the potential of the third control electrode 106c in operation is generated substantially only by a capacitive coupling of the third control electrode 106c to the first and second control electrodes 106a and 106b. By supplying potentials to the first and second control electrodes 106a and 106b, a charge redistribution at the third control electrode 106c is initiated which causes the potential of the third control electrode 106c in operation to be between the currently present potentials of the first control electrode 106a and second control electrode 106b. With at least one of the actively driven control electrodes 106a and 106b being driven with varying electric potential, continuous charge redistribution is effected in the third control electrode 106c. Distinguished from the first and second control electrodes 106a, 106b which have their potentials supplied by fixed potential sources or time-varying potential sources, the potential of the third control electrode 106c is not operational driven by a potential source. In some embodiments, the level of the third control electrode 106c may be always between $\frac{3}{4}\phi1+\frac{1}{4}\phi2$ and $\frac{3}{4}\phi2+\frac{1}{4}\phi1$, where $\phi1$ corresponds to the level of electric potential of the first control electrode 106a and $\phi2$ corresponds to the level of electric potential of the second control electrode 106b. In some embodiments, the level may be always approximately $\frac{1}{2}\phi1+\frac{1}{2}\phi2$.

Referring now to FIGS. 2A to 2E various embodiments for coupling and operating the third control electrode 106c are described. In the equivalent circuits shown in FIGS. 2A to 2E, the capacity between the control electrodes 106a and 106c is indicated as Cac and the capacity between the control electrodes 106c and 106b is indicated as Ccb. FIGS.

2A to 2E show the first control electrode 106a to be driven by a time-varying source 202 while the second control electrode 106b is held at a constant potential source 204.

Figure 2A:
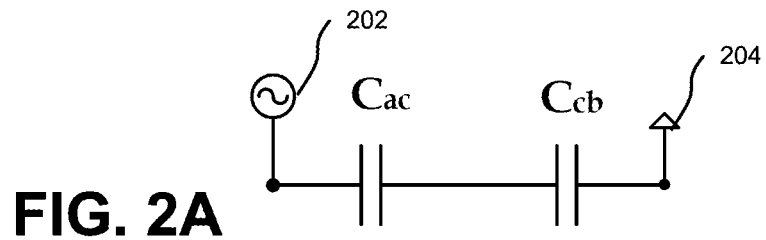
FIGS. 2A-2E show equivalent circuit representations according to embodiments.

FIG. 2A shows an embodiment in which the third control electrode 106c is floating, i.e. has no galvanic connection to a defined electric potential.

Figure 2B:
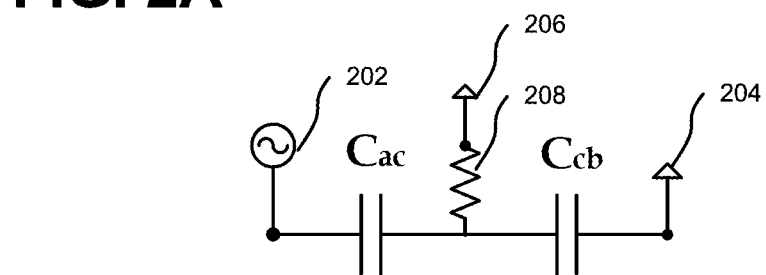

FIG. 2B shows the third control electrode 106c connected to a constant potential source 206 such that on a long time scale much longer than the time period of operation (i.e. the time period of the time-varying source 202) the discharging or charging of the control electrode is allowed in order to avoid parasitic long-term charging of the third control electrode 106c. In other words, the short term periodic variation of the potential of the third control electrode during operation is caused by the capacitive coupling while the connection to the fixed potential source prevents a long-term charge trapping on the electrode due to parasitic influences. Such parasitic influences may charge the third control electrode 106c to a high potential if no mechanism for equalizing is provided. FIG. 2B shows the realization of such a long-term charging/discharging by coupling the third control electrode 106c via a high ohmic resistive element 208 to the constant potential source 206.

Although the third control electrode 106c is connected to a fixed potential source, the third control electrode 106c is in such embodiments not operational driven by the fixed potential source since the charging time constant (RC constant) associated with the charging or discharging of the control electrode by the constant potential source 206 is provided higher or much higher than the time scale of the operation i.e. the time scale of the changes of the potential values. In other words, there is no signal actively supplied to the third control electrode 106c by a galvanic connection to a potential source which corresponds to the time-varying electric potential present at the third control electrode 106c during operation. For example, in embodiments the potential distribution in the semiconductor substrate generated by at least one of the actively driven control electrodes may vary periodically with a time period T. The third control electrode 106c may in such embodiments be connected to a fixed potential source such that the charging time constant associated with a charging of the third control electrode 106cby the fixed potential source is higher or much higher than the time period T. Thus, although the third control electrode 106c is connected to a fixed potential source, due to the long charging time constant provided by the resistive element 208, the electric potential on the third control electrode 106c is not held constant by the constant potential source 206 but varies in view of the capacitive coupling with the same time period of the drive signal provided to the first control electrode 106a as will be later explained with respect to FIG. 1B. In some embodiments, the time constant associated with the charging of the third control electrode 106c may be at least one decade higher than the time period T of operation. In other embodiments, the time constant associated with the charging of the third control electrode 106c may be at least two decades higher than the time period T of operation. In other embodiments, the time constant associated with the charging of the third control electrode 106c may be at least three decades higher than the time period T of operation. In some embodiments, the charging time constant is above $10^{-6}$ seconds. In some embodiments, the charging time constant is above $10^{-3}$ seconds.

In some embodiments, the high ohmic resistive element 208 may include an ohmic resistor of a resistance between 10 KΩ and 100 MΩ. Such high values may provide for charging time constant which are not influencing or disabling the short term operation of the third control electrode 106c as mentioned above.

Figure 1B:
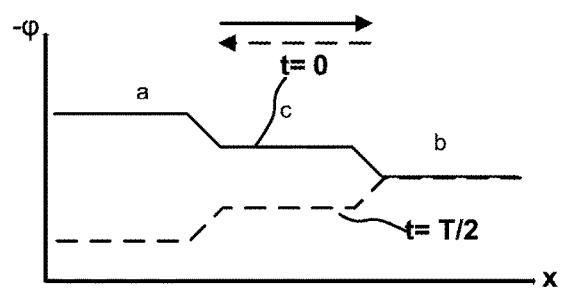
FIG. 1B shows an electric potential distribution according to an embodiment.
Figure 2C:
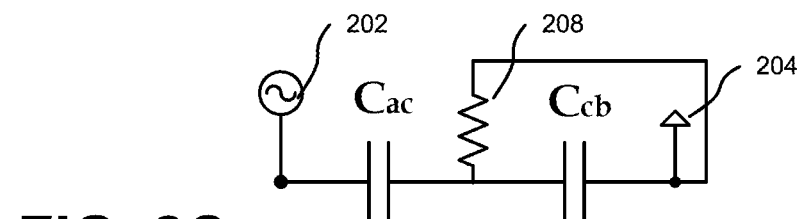

FIG. 2C shows an embodiment similar to FIG. 2B where the third control electrode 106c is coupled via the high ohmic resistive element 208 to the second control electrode 106b which is held at a constant potential by the connection to the constant potential source 204. However, although the third control electrode 106c is connected to the same electric potential source as the second control electrode 106b, the electric potential of the third control electrode 106c varies in time as will be described with respect to FIG. 1B due to the influence of the time-varying potential of the first control electrode 106a and the long time filtering by resistive element 208 while the electric potential of the second control electrode 106b is held constant due to the active driving on short-term time scale by the constant potential source 204.

Figure 2D:
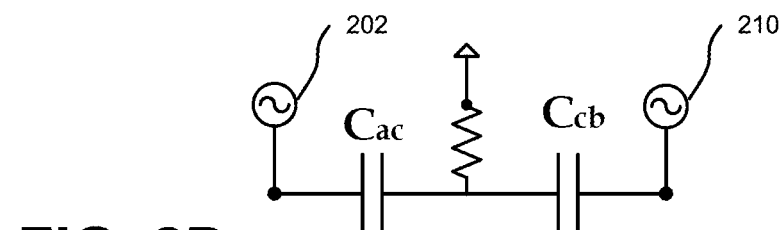

FIG. 2D shows the equivalent circuit of an embodiment where in addition to the first control electrode 106a also the second control electrode 106b is driven by a time-varying potential source 210.

Figure 2E:
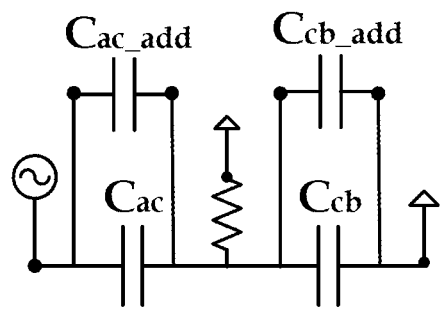

FIG. 2E shows an embodiment, where additional capacitors C_ac_add and Ca_cb_add are provided to enhance the capacitive coupling between the control electrodes 106a and 106c and between the control electrodes 106b and 106c, respectively. As shown in FIG. 2E, the additional capacitors C_ac_add and Ca_cb_add are provided in parallel to the capacities C_ac and C_cb, respectively. The additional capacitors C_ac_add and Ca_cb_add may be integrated on a same chip, or may be external to the chip for example provided as external capacitor within a same package or outside of the chip package.

Figure 6:
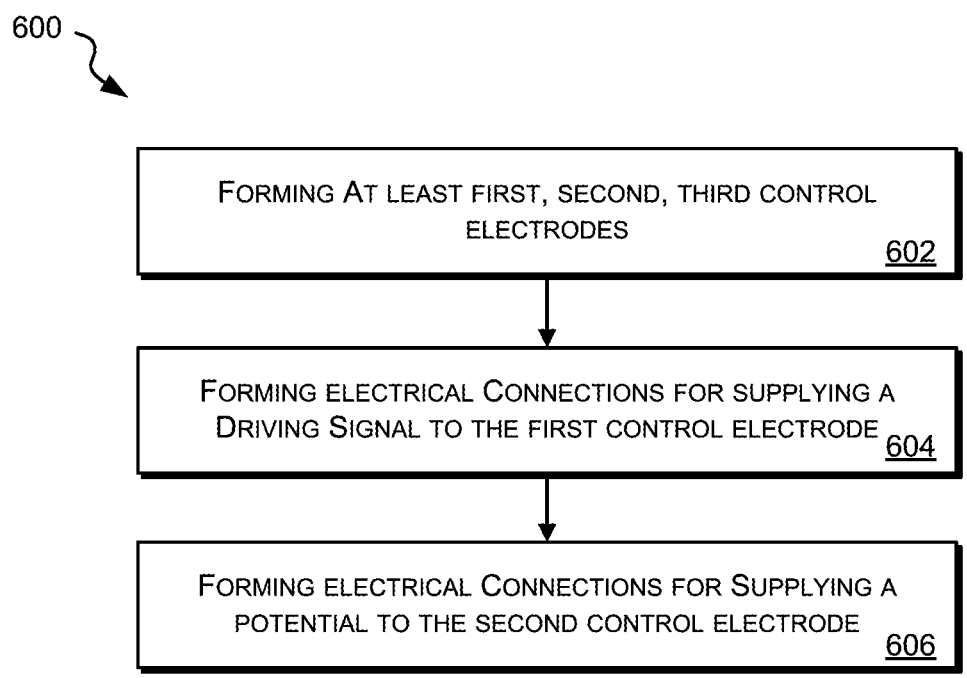
FIG. 6 shows a flow chart diagram according to an embodiment.

FIG. 6 shows a method 600 of manufacturing of a device such as the imager device 100 as explained above. The method includes the forming of at least first, second and third control electrodes, 602, and the forming of electrical connections for supplying a driving signal to at least the first control electrode, 604. In 606 electrical connections are formed for supplying a potential to the second control electrode.

Figure 7:
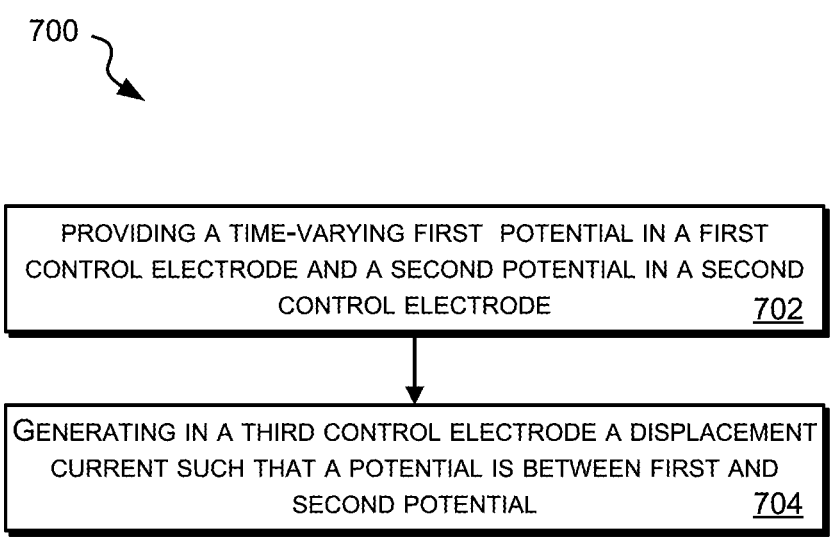
FIG. 7 shows a flow chart diagram according to an embodiment.

FIG. 7 shows a method 700 of operating including the providing of a time-varying first potential in a first control electrode and a second potential in a second electrode, 702. Then, by the capacitive coupling, a displacement current is generated in the third control electrode such that the potential of the third electrode is between the potential of the first and second control electrode, 704.

FIG. 1B shows a diagram resulting from an example operation of the control electrodes 106a, 106b and 106C of FIG. 1A according to an embodiment. FIG. 1B shows as abscissa the electric potential distribution as negative electric potential caused by the control electrodes 106a, 106b, 106c in the semiconductor regions below the control gates. The negative electric potential corresponds to the potential energy seen by photo-generated electrons which are in the described embodiments the charge carriers to be transferred by the control electrodes 106a, 106b, 106c.

As can be seen, the potential applied to the first control electrode 106a (indicated in FIG. 1B by "a") varies such that a maximum of the potential energy is obtained at time t=0 and a minimum is obtained at time t=T/2. The second control electrode 106b (indicated in FIG. 1B by "b") is kept constant as shown for example in the embodiments described with respect to FIGS. 2A, 2B, 2C and 2E.

In view of the potential of the third control electrode 106c (indicated in FIG. 1B by "c") influenced by the capacitive coupling to be between the potentials of the first and second control electrodes 106a, 106b, the potential of the third control electrode 106c changes synchronous with the potential variation of the first control electrode however with a smaller amplitude. As the electric potential of the third control electrode 106c lies between the two potentials of the first and second control electrodes 106a and 106b, the amplitude of the third control electrode 106c is smaller than the amplitude of the first control electrode 106a. The amplitude of the third control electrode 106c depends on the capacitive coupling to the actively driven control electrodes 106a and 106b. In view of this a step wise cyclic varying potential distribution is generated which causes the electrons to be transferred at time t=0 and t=T/2 in opposite directions as indicated by the arrows in FIG. 1B.

It is further to be noted that the number of steps in the potential distribution generated by the control electrode configuration can be increased by adding additional non-actively driven control electrodes similar to the third control electrode 106c between the active driven control electrodes 106a and 106b. If the number of non-actively driven control electrodes is K, the number of steps in the potential distribution adds up to K+1.

With the potential of the third control electrode not being operational driven directly by a potential source, the amount of current supplied to the control electrodes 106a, 106b, 106c is reduced compared to an operational driving of the third control electrode 106c by varying potential sources or current sources which would have to be galvanically connected to the third control electrode 106c for active operational driving. Thus, the device 100 has a reduced current drain compared to an active driving of the third control electrode 106c. On the other hand, compared to a situation where only the two actively driven control electrodes 106a and 106b are used for generating the potential distribution, the addition of the non-actively driven control electrode increase the number of steps which is advantageous as will be described below.

The above described new concept of capacitive coupling for control electrodes may for example in one embodiment be used in a photon mixer device of an optical time of flight sensor where it is required to manipulate the carriers generated in the silicon or other semiconductors by the incoming light phase sensitive to a reference signal. Such devices demodulate a modulated incoming light already in the respective pixels. The generated charge carriers are guided by the electric field generated by the control electrodes to a read out node and a signal evaluation circuit. In optical time-of flight sensors the controlling of the control electrodes is time critical since the result depends on the application of the control signals in time. In view of this, some embodiments may use only two actively driven control electrodes while one control electrodes is maintained on a constant electric potential. Below the control electrodes, the electric potential in a lateral direction is approximately constant. Therefore, the charge carriers move below the control electrodes mainly by the slower diffusion compared to movement by drift. In time critical applications, this may be a limiting factor since it might take too long for the charge carrier to move in the lateral direction only by diffusion. Also, with diffusion, a certain percentage of the charge carriers is lost and does not reach the read out node. This reduces the effectiveness of the control electrodes. Therefore, according to embodiments, the lateral length of the control electrodes in the direction to the read out node (e.g. one or more photo diodes) may be limited.

A further issue in the manufacturing is that the rather high capacitive coupling of the control electrodes in particular when the distance between adjacent control electrodes is short. This leads to a high current consumption of the circuitry. Increasing the distance between adjacent control electrodes may reduce the current consumption but leads to a high amount of area between the control electrodes where no control electrode is present and therefore no voltage can be applied. This reduces the control of the charge carriers in these inter-electrode areas. In addition, in the fabrication of the control electrode structure, the semiconductor interface area is subject to certain chemical or mechanical or other treatment which may cause modifications of the semiconductor interface area between the control electrodes resulting in increased recombination at the interface area which are no longer optimal.

The above described concept addresses these issues and provides a new design capability which can provide for an improved controlling of photo-generated charge carriers by control electrodes with lower current consumption. The concept allows having one or more control electrodes between actively driven control electrodes. This allows having the actively driven control electrodes laterally separated by a longer distance while the interface area which is not covered by control electrodes can be kept small. As explained already above, the actively driven control electrodes may in one embodiment include a first control electrode driven with a varying electric potential which may be for example a periodic varying electric potential and a second control electrode connected to a source such that the potential at the control electrode is held constant. The control electrodes between the actively driven control electrodes are influenced by the capacitive coupling to the actively driven control electrodes.

Figure 3A:
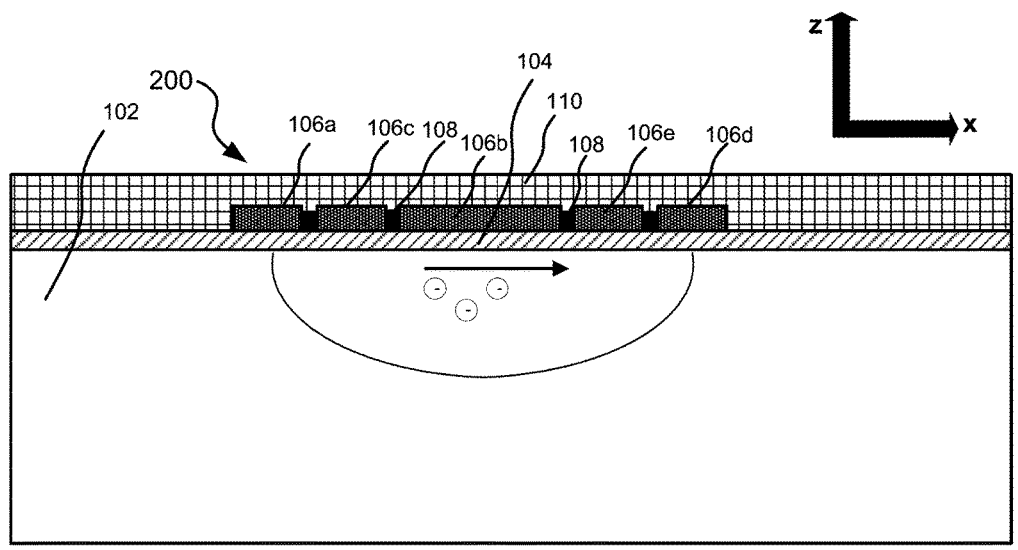
FIG. 3A shows a cross-sectional view according to an embodiment

Referring now to FIG. 3A, a further embodiment will be described. FIG. 3A shows a device 200 with a pixel having a symmetric control electrode configuration in which the second control electrode 106b is the centre of symmetry. The control electrode configuration comprises at the two lateral ends the first control electrode 106a and a further actively driven control electrode 106d. In addition to the third control electrode 106c which is arranged between the control electrodes 106a and 106b, a control electrode 106e is provided between the control electrodes 106b and 106d. Control electrode 106e may have functionalities and connections similar to the third control electrode 106c as explained above with respect to FIGS. 1A, 1B, 2A to 2E. It is to be noted that the second control electrode 106b in the center may have an increased lateral extension compared to the other control electrodes as shown in FIG. 3A.

Figure 3B:
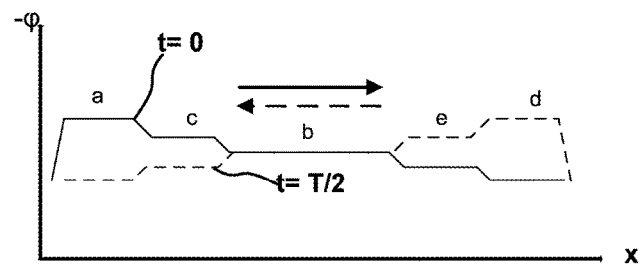
FIG. 3B shows an electric potential distribution according to an embodiment.

FIG. 3B shows a diagram resulting from an example operation of the control electrode configuration shown in FIG. 3A. FIG. 3B shows as abscissa the negative electric potential caused by the control electrodes 106b, 106c, 106d, 106e in the semiconductor regions below the control gates.

The potential energy below the first control electrode 106a (indicated in FIG. 3B by "a") and the control electrode 106d (indicated in FIG. 3B by "a") vary such that at time t=0 a maximum of the potential energy is obtained for control electrode and a minimum is obtained for control electrode 106d. At time t=T/2 a minimum of the potential energy is obtained for control electrode and a maximum is obtained for control electrode 106d. In other words, an electric circuit is provided which applies a first driving signal to the first control electrode 106a and a second driving signal to the control electrode 106d such that the first driving signal and the second driving signal are phase-shifted by 180°.

As shown in FIG. 3B, the potential energy below control electrode 106b (indicated in FIG. 1B by "b") is kept constant in time due to the connection to a fixed potential source as shown for example in the embodiments described with respect to FIGS. 2A, 2B,2C and 2E.

As explained above, the control electrodes 106c and 106e introduce additional steps in the potential distribution with the above described advantages. The above described configuration allows transferring the photo-generated charge carriers symmetrically in the direction of both lateral ends.

Figure 4A:
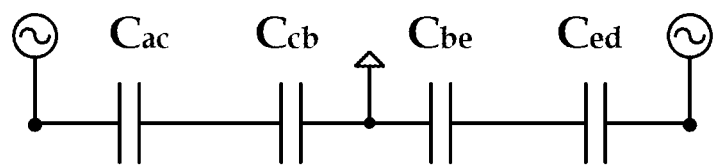
FIGS. 4A-4C show equivalent circuit representations according to embodiments.
Figure 4B:
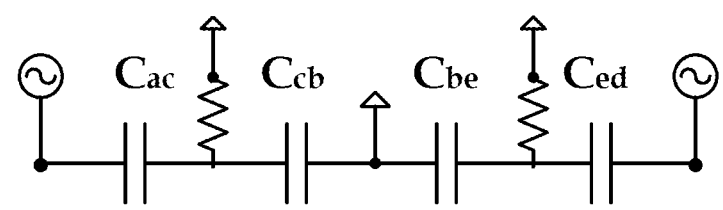
Figure 4C:
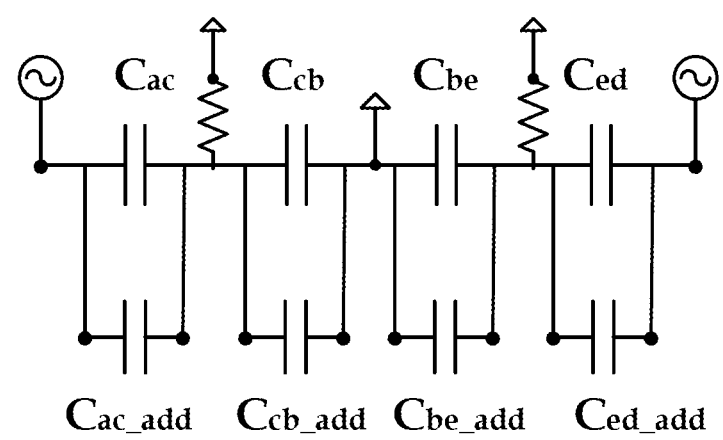

The configuration and functionality of the embodiment of FIG. 3A may include the configuration and functionalities described in the embodiments shown in FIGS. 2A to 2E. FIG. 4A shows an embodiment similar to FIG. 2A wherein the control electrodes 106c and 106e are implemented as floating electrodes. FIG. 4B shows an embodiment similar to FIG. 2B wherein the control electrodes 106c and 106e are connected to a fixed electric potential source via high ohmic resistive element s to allow charge exchange with a long RC time constant. FIG. 4C shows an embodiment similar to FIG. 2E with additional capacitors added in parallel.

Figure 5A:
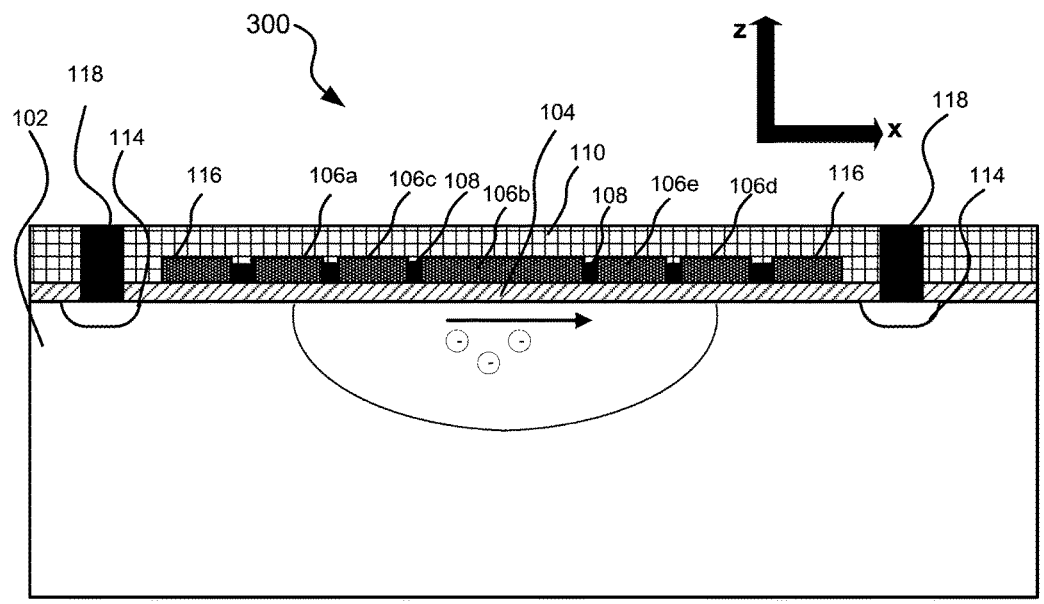
FIG. 5A shows a cross-sectional view according to an embodiment.

Referring now to FIG. 5A, a device 300 according to a further embodiment is shown. The device 300 includes the same control electrode configuration as shown in FIG. 3A. At both lateral ends of the control electrode configuration, guard electrodes 116 are arranged which are provided at a fixed potential to reduce electric coupling effects outside of the pixel shown in FIG. 5A. Such electric coupling effects can be caused by the time-varying signals when operated for example in the range between 10 MHz and 500 MHz.

Furthermore, FIG. 5A shows photo-diodes 118 including a doped well 114 at both lateral ends as read-out nodes for the photo-generated charge carriers. It is to be understood that other embodiments may include other concepts of read-out nodes to which the photo-generated charge carriers are transferred by the signals of the control electrodes. Such read-out nodes may include in other embodiments for example combinations of diodes or transistors.

Figure 5B:
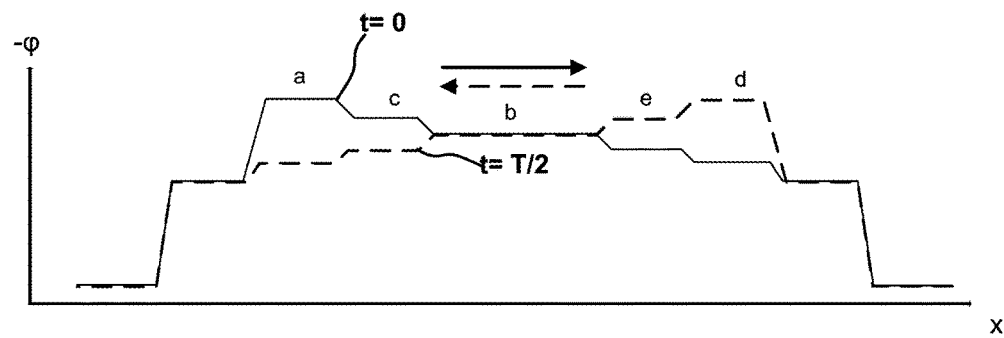
FIG. 5B shows an electric potential distribution according to an embodiment.

FIG. 5B shows the corresponding potential distribution with the portion below the guard electrodes 116 and the region of the photo diode 118 being constant and not influenced by the time-varying potential distribution generated by the control electrode configuration.

In the above description, embodiments have been shown and described herein enabling those skilled in the art in sufficient detail to practice the teachings disclosed herein. Other embodiments may be utilized and derived there from, such that structural and logical substitutions and changes may be made without departing from the scope of this disclosure.

This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that specific terms used in the description and claims may be interpreted in a very broad sense. For example, the terms "circuit" or "circuitry" used herein are to be interpreted in a sense not only including hardware but also software, firmware or any combinations thereof. The term "data" may be interpreted to include any form of representation such as an analog signal representation, a digital signal representation, a modulation onto carrier signals etc. The term "information" may in addition to any form of digital information also include other forms of representing information. The term "entity" or "unit" may in embodiments include any device, apparatus circuits, hardware, software, firmware, chips or other semiconductors as well as logical units or physical implementations of protocol layers etc. Furthermore the terms "coupled" or "connected" may be interpreted in a broad sense not only covering direct but also indirect coupling.

It is further to be noted that embodiments described in combination with specific entities may in addition to an implementation in these entity also include one or more implementations in one or more sub-entities or sub-divisions of said described entity. For example, specific embodiments described herein described herein to be implemented in a TOF imager device may be implemented in other imager devices or other devices with a need for a fast and efficient collection of carriers in a predefined area.

The accompanying drawings that form a part hereof show by way of illustration, and not of limitation, specific embodiments in which the subject matter may be practiced.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or multiple dependent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple sub steps. Such sub steps may be included and part of the disclosure of this single step unless explicitly excluded.

What is claimed is:

1. A method, comprising:
    forming a first control electrode, a second control electrode, and a third control electrode,
        the first control electrode, the second control electrode, and the third control electrode being formed to provide, during operation of an imager device, an electric potential distribution for transferring photo-generated charge carriers,
        the first control electrode, the second control electrode, and the third control electrode being laterally separated;
    forming a first electrical connection to permit a first electric potential to be provided to the first control electrode by a first electric potential source;
    forming a second electrical connection to permit a second electric potential to be provided to the second control electrode by a second electric potential source,
        the second electric potential source being different from the first electric potential source,
        the third control electrode having a capacitive coupling to the first control electrode and the second control electrode such that a third electric potential is generated at the third control electrode,
            the third electric potential having a value between a value of the first electric potential and a value of the second electric potential; and
    forming a third electrical connection between the third control electrode and a third electric potential source such that a charging time constant of the third control electrode is higher than a time period of operation of the first electric potential source,
        the third electric potential source being different than the first electric potential source.

2. The method of claim 1, further comprising:
    forming a first capacitor connected to the first control electrode and the third control electrode for capacitive coupling the third control electrode to the first control electrode; and
    forming a second capacitor connected to the second control electrode and the third control electrode for capacitive coupling the third control electrode to the second control electrode.

3. The method of claim 1, where the third control electrode is laterally separated from the first control electrode or the second control electrode by a distance with a value between 50 nanometers and 1 micrometer.

4. The method of claim 1, where the third control electrode is laterally separated from the first control electrode or the second control electrode by a distance with a value between 0.1 micrometers and 0.5 micrometers.

5. The method of claim 1, where the charging time constant is greater than $10^{-6}$ seconds.

6. The method of claim 1, where the charging time constant is greater than $10^{-3}$ seconds.

7. The method of claim 1, where the third electrical connection is formed to include a resistive element having a resistance between 10 kiloohms and 100 megaohms.

8. The method of claim 1, where the second control electrode and the third control electrode are connected to a same electric potential source.

9. The method of claim 1, further comprising:
    forming a fourth control electrode; and
    forming a fifth control electrode,
        the fifth control electrode having a capacitive coupling to the second control electrode and the fourth control electrode such that a fifth electric potential of the fifth control electrode is generated at the fifth control electrode,
            the fifth electric potential having a value between a value of a fourth electric potential, applied to the fourth control electrode, and the value of the second electric potential.

10. A method, comprising:
    forming a first control electrode, a second control electrode, and a third control electrode,
        the first control electrode, the second control electrode, and the third control electrode being configured to provide, during operation of an imager device, an electric potential distribution for transferring photo-generated charge carriers, and
        the third control electrode being positioned between the first control electrode and the second control electrode;
    forming a first electrical connection to permit a first electric potential to be provided to the first control electrode by a first electric potential source,
        the first electric potential being a time-varying electric potential;
    forming a second electrical connection to permit a second electric potential to be provided to the second control electrode by a second electric potential source,
        the second electric potential source being different from the first electric potential source,
        the third control electrode having a capacitive coupling to the first control electrode and the second control electrode such that a third electric potential is generated at the third control electrode,
            a value of the third electric potential being between a value of the first electric potential and a value of the second electric potential; and
    forming a third electrical connection between the third control electrode and a third electric potential source such that a charging time constant of the third control electrode is higher than a time period of operation of the first electric potential source,
        the third electric potential source being different from the first electric potential source.

11. The method of claim 10, further comprising:
    forming a first capacitor for capacitive coupling the third control electrode to the first control electrode,
        the first capacitor being connected to the first control electrode and the third control electrode; and
    forming a second capacitor for capacitive coupling the third control electrode to the second control electrode,
        the second capacitor being connected to the second control electrode and the third control electrode.

12. The method of claim 10, where the third control electrode is separated from the first control electrode and the second control electrode by a first structure and a second structure, respectively,
    the first structure being configured to electrically isolate the first control electrode from the third control electrode, and
    the second structure being configured to electrically isolate the second control electrode from the third control electrode.

13. The method of claim 10, further comprising:
    forming a cover layer over the first control electrode, the second control electrode, and the third control electrode.

14. The method of claim 10, further comprising:
forming a first guard electrode and a second guard electrode to reduce an effect of electric coupling,
the first control electrode, the second control electrode, and the third control electrode being positioned between the first guard electrode and the second guard electrode.

15. The method of claim 10, further comprising:
forming a first read-out node and a second read-out node for the photo-generated charge carriers,
the first read-out node including a first photo-diode and a first doped well,
the second read-out node including a second photo-diode and a second doped well, and
the first control electrode, the second control electrode, and the third control electrode being positioned between the first read-out node and the second read-out node.

16. The method of claim 10, where the third control electrode is separated from the first control electrode or the second control electrode by a distance from 50 nanometers to 1 micrometer.

17. The method of claim 10, where the third control electrode is separated from the first control electrode or the second control electrode by a distance from 0.1 micrometers to 0.5 micrometers.

18. The method of claim 10, where the second electric potential is a time-varying electric potential.

19. The method of claim 10, where the second electric potential source and the third electric potential source are the same electric potential source.

20. A method, comprising:
forming a first control electrode, a second control electrode, and a third control electrode,
the first control electrode, the second control electrode, and the third control electrode being configured to provide, during operation of an imager device, an electric potential distribution for transferring photo-generated charge carriers,
the first control electrode, the second control electrode, and the third control electrode being separated on a substrate surface;
forming a first electrical connection to permit a first electric potential to be provided to the first control electrode by a first electric potential source,
the first electric potential being a time-varying electric potential;
forming a second electrical connection to permit a second electric potential to be provided to the second control electrode by a second electric potential source,
the second electric potential source being different from the first electric potential source,
the third control electrode having a capacitive coupling to the first control electrode and the second control electrode such that a third electric potential is generated at the third control electrode,
a value of the third electric potential being different than a value of the first electric potential and a value of the second electric potential; and
forming a third electrical connection between the third control electrode and a third electric potential source such that a charging time constant of the third control electrode is higher than a time period of operation of the first electric potential source,
the third electric potential source being different from the first electric potential source.

21. The method of claim 20, where the charging time constant is greater than $10^{-6}$ seconds.

22. The method of claim 20, where the third electrical connection is formed to include a resistive element having a resistance between 10 kiloohms and 100 megaohms.

23. The method of claim 20, where the second electric potential source and the third electric potential source are the same electric potential source.

24. The method of claim 20, further comprising:
forming a fourth control electrode; and
forming a fifth control electrode,
the fifth control electrode having a capacitive coupling to the second control electrode and the fourth control electrode such that a fifth electric potential of the fifth control electrode is generated at the fifth control electrode,
the fifth electric potential having a value different than a value of a fourth electric potential, applied to the fourth control electrode, and the value of the second electric potential.

25. The method of claim 20, further comprising:
forming a first guard electrode and a second guard electrode to reduce an effect of electric coupling,
the first control electrode, the second control electrode, and the third control electrode being positioned between the first guard electrode and the second guard electrode.

26. The method of claim 20, further comprising:
forming a first read-out node and a second read-out node for the photo-generated charge carriers,
the first control electrode, the second control electrode, and the third control electrode being positioned between the first read-out node and the second read-out node.

27. The method of claim 1, where the first electric potential is a time-varying electric potential, and
where the charging time constant is at least one decade higher than the time period of operation of the first electric potential source that provides the time-varying electric potential.

28. The method of claim 1, where the first electric potential is a time-varying electric potential, and
where the charging time constant is at least two decades higher than the time period of operation of the first electric potential source that provides the time-varying electric potential.

29. The method of claim 1, where the first electric potential is a time-varying electric potential, and
where the charging time constant is at least three decades higher than the time period of operation of the first electric potential source that provides the time-varying electric potential.

30. The method of claim 10, where the charging time constant is greater than $10^{-3}$ seconds.

31. The method of claim 10, where the charging time constant is greater than $10^{-6}$ seconds.

32. The method of claim 20, where the charging time constant is greater than $10^{-3}$ seconds.

* * * * *